(12) United States Patent
Bailey et al.

(10) Patent No.: US 7,551,115 B2
(45) Date of Patent: Jun. 23, 2009

(54) SYSTEMS AND METHODS FOR PIPELINED ANALOG TO DIGITAL CONVERSION

(75) Inventors: James A. Bailey, Snowflake, AZ (US); Mingdeng Chen, Cupertino, CA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 12/025,897

(22) Filed: Feb. 5, 2008

(65) Prior Publication Data

US 2009/0128391 A1 May 21, 2009

Related U.S. Application Data

(60) Provisional application No. 60/989,408, filed on Nov. 20, 2007.

(51) Int. Cl.
 *H03M 1/38* (2006.01)
(52) U.S. Cl. ...................... 341/161; 341/155
(58) Field of Classification Search ............... 341/155, 341/172, 122, 161, 163
 See application file for complete search history.

(56) References Cited

U.S. PATENT DOCUMENTS

| | | | |
|---|---|---|---|
| 6,784,824 B1 * | 8/2004 | Quinn | 341/172 |
| 6,956,519 B1 * | 10/2005 | Huang et al. | 341/172 |
| 7,002,504 B2 | 2/2006 | McMahill | |
| 7,209,068 B1 | 2/2006 | Chen et al. | |
| 7,471,228 B2 * | 12/2008 | Cho et al. | 341/162 |

2006/0071709 A1 4/2006 Maloberti et al.

OTHER PUBLICATIONS

Brandt et al., "A 75-mW, 10-b, 10 MSPS CMOS Subranging ADC with 9.5 Effective Bits at Nyquist", IEEE J. Solid State Circuits, vol. 34, No. 12, pp. 1788-1795, Dec. 1999.
Daito et al., "A 14-bit 20-MS/s Pipelined ADC With Digital Distortion Calibration," IEEE J. Solid-State Circuits, vol. 41, No. 11, pp. 2417-2423, Nov. 2006.
Gupta et al., "A 1GS/s 11b Time Interleaved ADC in 0.13um CMOS", ISSCC Dig. Tech. Papers, pp. 576-577, Feb. 2006.
Kim et al., "A 10-b, 10MS/s CMOS A/D Converter", IEEE J. Solid State Circuits, vol. 32, No. 3, pp. 302-311, Mar. 1997.

(Continued)

*Primary Examiner*—Brian Young
(74) *Attorney, Agent, or Firm*—Hamilton, DeSanctis & Cha

(57) ABSTRACT

Various embodiments of the present invention provide systems and circuits that provide for conversion of analog signals to digital signals. For example, various embodiments of the present invention provide methods for performing analog to digital conversions that include providing an analog to digital converter with a residue amplifier that is associated with a first capacitance set that includes a first feedback capacitor and first set of input capacitors, and a second capacitance set that includes a second feedback capacitor and second set of input capacitors. The methods further include performing a first sample of an analog input voltage by charging the first set of input capacitors from the analog voltage input during a first period; amplifying the first sample during a second period; performing a second sample of the analog input voltage by charging the second set of input capacitors from the analog voltage input during a third period; and amplifying the second sample during a fourth period.

22 Claims, 8 Drawing Sheets

OTHER PUBLICATIONS

Mehr et al., "A 55-mW, 10-bit, 40-Msample/s Nyquist-Rate CMOS ADC," IEEE J. Solid-State Circuits, vol. 35, No. 3, pp. 302-311, Mar. 2000.

Nagaraj et al., "A 250 mW 8-b, 52 Msamples/s Parallel-pipelined A/D Converter with Reduced Number of Amplifiers", IEEE J. Solid State Circuits, vol. 32,pp. 312-320, Mar. 1997.

Singer et al., "A 14-bit 10-MHz calibration-free CMOS pipelined A/D converter," in symp. VLSI Circuits Dig. Tech. Papers, Jun. 1996, pp. 38-39.

U.S. Appl. No. 12/024,893, filed Feb. 1, 2008, Bailey.
U.S. Appl. No. 12/024,909, filed Feb. 1, 2008, Bailey.
U.S. Appl. No. 12/025,914, filed Nov. 20, 2007, Bailey et al.

* cited by examiner

US 7,551,115 B2

SYSTEMS AND METHODS FOR PIPELINED ANALOG TO DIGITAL CONVERSION

CROSS REFERENCE TO RELATED APPLICATIONS

The present application claims priority to (is a non-provisional of) U.S. Provisional Patent Application No. 60/989,408 entitled "Systems and Methods for Pipelined Analog to Digital Conversion", and filed Nov. 20, 2007 by Bailey et al. The entirety of the aforementioned application is incorporated herein by reference for all purposes.

BACKGROUND OF THE INVENTION

The present invention is related to electronic signal conversion, and more particularly to pipelined analog to digital converters.

Pipelined analog to digital converters exist, but often offer complex and sometimes unsolvable timing problems. In particular, existing pipelined analog to digital converters often have difficult to meet residue amplifier gain-bandwidth requirements.

Pipelined analog to digital converters exist that use a sampling capacitor charged on one phase of a clock, and a corresponding feedback capacitor that is charged on the opposite phase of the clock. The sampling capacitor stores the analog to digital converter input minus the coarse digital to analog converter output. An example of a portion of one such analog to digital converter is depicted in FIG. 1. Turning to FIG. 1, a differential analog to digital converter 100 including a sampling capacitor (the additive combination of parallel capacitors C1n-C4n and C1p-C4p) is shown. Sampling capacitors C1n-C4n are each selectably connected to either a positive side of a differential analog voltage input 120, a positive reference voltage 122 or a negative reference voltage 124 via switches 126. Similarly, sampling capacitors C1p-C4p are each selectably connected to either a negative side of a differential analog voltage input 121, positive reference voltage 122 or negative reference voltage 124 via switches 128. In operation during a first clock phase (i.e., $\Phi_1$), all sampling capacitors (C1n, C2n, C3n, C4n, C1p, C2p, C3p, C4p) are connected between inputs of an operational amplifier 110 and an analog voltage input (i.e., positive input 120 or negative input 121). Also, operational amplifier 110 is connected with unity gain feedback. The capacitor charge at the end of the first clock phase is therefore:

$$Q_{C1P}=Q_{C2P}=Q_{C3P}=Q_{C4P}=Q_{C1N}=Q_{C2N}=Q_{C3N}=Q_{C4N}.$$

During a second clock phase (i.e., $\Phi_2$), feedback capacitors 130 are connected from respective legs of a differential output 140 to respective inputs 145 of operational amplifier 110. At the same time, the sampling capacitors (C1n, C2n, C3n, C4n, C1p, C2p, C3p, C4p) are connected between a selected reference voltage (either +Vref or −Vref) and the operational amplifier inputs 145. In some configurations the feedback capacitors are discharged rather than being connected to the input. During this phase (i.e., $\Phi_2$), the residue is calculated as the difference between Vin and the MDAC output. Both operations of sampling and resolving the residue are performed in sequence during a single clock cycle consisting of two substantially equal periods (i.e., $\Phi_1$ and $\Phi_2$). Usually, one half of the clock period is allowed for sampling the input (i.e., $\Phi_1$), and the remaining one half clock period is used for computing the residue (i.e., $\Phi_2$). This approach limits the time budget for resolving any residue, and hence increases the required operational bandwidth of the circuit implementing such an approach.

Hence, for at least the aforementioned reasons, there exists a need in the art for advanced systems, circuits and methods for electronic signal conversion.

BRIEF SUMMARY OF THE INVENTION

The present invention is related to electronic signal conversion, and more particularly to pipelined analog to digital converters.

Various embodiments of the present invention provide systems and circuits that provide for conversion of analog signals to digital signals. For example, various embodiments of the present invention provide methods for performing analog to digital conversions that include providing an analog to digital converter with a residue amplifier that is associated with a first capacitance set that includes a first feedback capacitor and first set of input capacitors, and a second capacitance set that includes a second feedback capacitor and second set of input capacitors. The methods further include performing a first sample of an analog input voltage by charging the first set of input capacitors from the analog voltage input during a first period; amplifying the first sample during a second period; performing a second sample of the analog input voltage by charging the second set of input capacitors from the analog voltage input during a third period; and amplifying the second sample during a fourth period. In such cases, the first period overlaps the fourth period, and the third period overlaps the second period. In some instances of the aforementioned embodiments, the first period and the third period are each approximately one half clock cycle, and the second period and the fourth period are each one full clock cycle. Further, the first period and the third period may be mutually exclusive, and the second period and the fourth period may be mutually exclusive.

In various instances of the aforementioned embodiments, the methods further include transferring charge from the first set of input capacitors to the first feedback capacitor during a fifth period continuing subsequent to the first period, and transferring charge from the second set of input capacitors to the second feedback capacitor during a sixth period continuing subsequent to the third period. In some instances, the analog to digital converter further includes a sub-adc. The sub-adc receives the analog voltage input and provides a digital representation of the analog voltage input. The digital representation of the analog voltage input is used to perform a voltage subtraction from the first set of input capacitors to leave a first residue value, and a subsequent digital representation of the analog voltage input is used to perform a voltage subtraction from the second set of input capacitors to leave a second residue value. Amplifying the first sample during a second period is amplifying the first residue value; and amplifying the second sample during a fourth period is amplifying the second residue value.

Other embodiments of the present invention provide analog to digital converters that include a residue amplifier. The residue amplifier is associated with a first capacitance set that includes a first feedback capacitor and first set of input capacitors, and a second capacitance set that includes a second feedback capacitor and second set of input capacitors. The first capacitance set is separately switched from the second capacitance set. In some cases, charging of the first set of input capacitors is interleaved with charging of the second set of input capacitors, and charge transfer from the first set of input capacitors to the first feedback capacitor is interleaved with charge transfer from the second set of input capacitors to the second feedback capacitor. In some cases, a portion of a clock cycle is provided for charging the first set of input capacitors, and a full clock cycle is provided for settling the residue amplifier.

In particular instances of the aforementioned embodiments, the first set of input capacitors are electrically coupled to an analog voltage input during a first period, the second set of input capacitors are electrically coupled to the residue amplifier during the first period, the second set of input capacitors are electrically coupled to the analog voltage input during a second period, and the second set of input capacitors are electrically coupled to the residue amplifier during the second period. In various instances of the aforementioned embodiments, the analog to digital converter further includes a sub-adc. The sub-adc receives the analog voltage input and provides a digital representation of the analog voltage input, and the digital representation of the analog voltage input is used to perform a voltage subtraction from the first set of input capacitors to leave a first residue value. A subsequent digital representation of the analog voltage input is used to perform a voltage subtraction from the second set of input capacitors to leave a second residue value.

Yet other embodiments of the present invention provide analog to digital converters that include a residue amplifier and a sub-adc. The residue amplifier is associated with a first pair of a first feedback capacitor and first set of input capacitors, and a second pair of a second feedback capacitor and second set of input capacitors. The first pair is separately switched from the second pair. An output from the sub-adc controls a first value subtraction from a first value maintained on the first set of input capacitors to create a first residue value, and a second value subtraction from a second value maintained on the second set of input capacitors to create a second residue value. In some cases, approximately one half of a clock cycle is provided for charging the first set of input capacitors to a value corresponding to an analog voltage input, and wherein a full clock cycle is provided for amplifying the first residue value. In some such cases, the value corresponding to the analog voltage input is a first value, the approximately one half clock cycle is a first period, and the full clock cycle is a second period. A third period corresponding in length to the first period is provided for charging the second set of input capacitors to a second value corresponding to the analog voltage input, and a fourth period corresponding in length to the second period is provided for amplifying the second residue value. The first period and the third period are mutually exclusive, and the second period and the fourth period are mutually exclusive.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 6 shows a particular implementation of switched residue amplifier of FIG. 2a.

DETAILED DESCRIPTION OF THE INVENTION

The present invention is related to electronic signal conversion, and more particularly to pipelined analog to digital converters.

Pipelined analog to digital converters are one of the most popular analog to digital converter architectures for medium to high speed conversions. Typically, the gain-bandwidth requirements of the pipelined residue amplifiers are the bottlenecks of the achievable conversion speed and usually they consume most of the power in the analog to digital converters. Some embodiments of the present invention utilize a time interleaved, double sampling scheme to reduce the gain-bandwidth requirements of the residue amplifier and/or increase the overall throughput. Such embodiments of the present invention effectively increase the period during which residue amplifying/settling time occur allowing for increased throughput, and/or equivalently reduce the gain-bandwidth requirements of the residue amplifiers to allow for a decrease in power consumption.

Various embodiments of the present invention use a static calibration of the residue amplifier offset. Further, such embodiments employ two sets of sampling and feedback capacitors to perform double sampling of the input. As just one of many advantages achievable through use of embodiments of the present invention, the combination of the aforementioned techniques provide a full clock cycle for the residue amplifier to settle. Based on the disclosure provided herein, one of ordinary skill in the art will recognize a variety of other advantages that may be achieved through use of different embodiments of the present invention.

One half of each clock cycle is used to pre-charge the capacitor and to capture the residue amplifier offset on the sampling capacitor. A single residue amplifier may be shared between two pipeline stages. During the input sampling clock phase, the capacitors are connected to the input but not to the amplifier while the input capacitors for the next stage are connected to the residue amplifier. This forms a sort of double sampling, however, amplifier offset is ignored or estimated digitally. Double sampling is used for the sample/hold (S/H) block but not for the sub-ADC stages. Both pre-charging a single sampling capacitor and capturing the offset require that the residue amplifier settle to the needed accuracy within one half clock cycle. Therefore the available amplifier settling time is at most one half clock cycle. This requires the bandwidth of the amplifier to be doubled, increasing the power dissipation of the amplifier.

Figure 1:
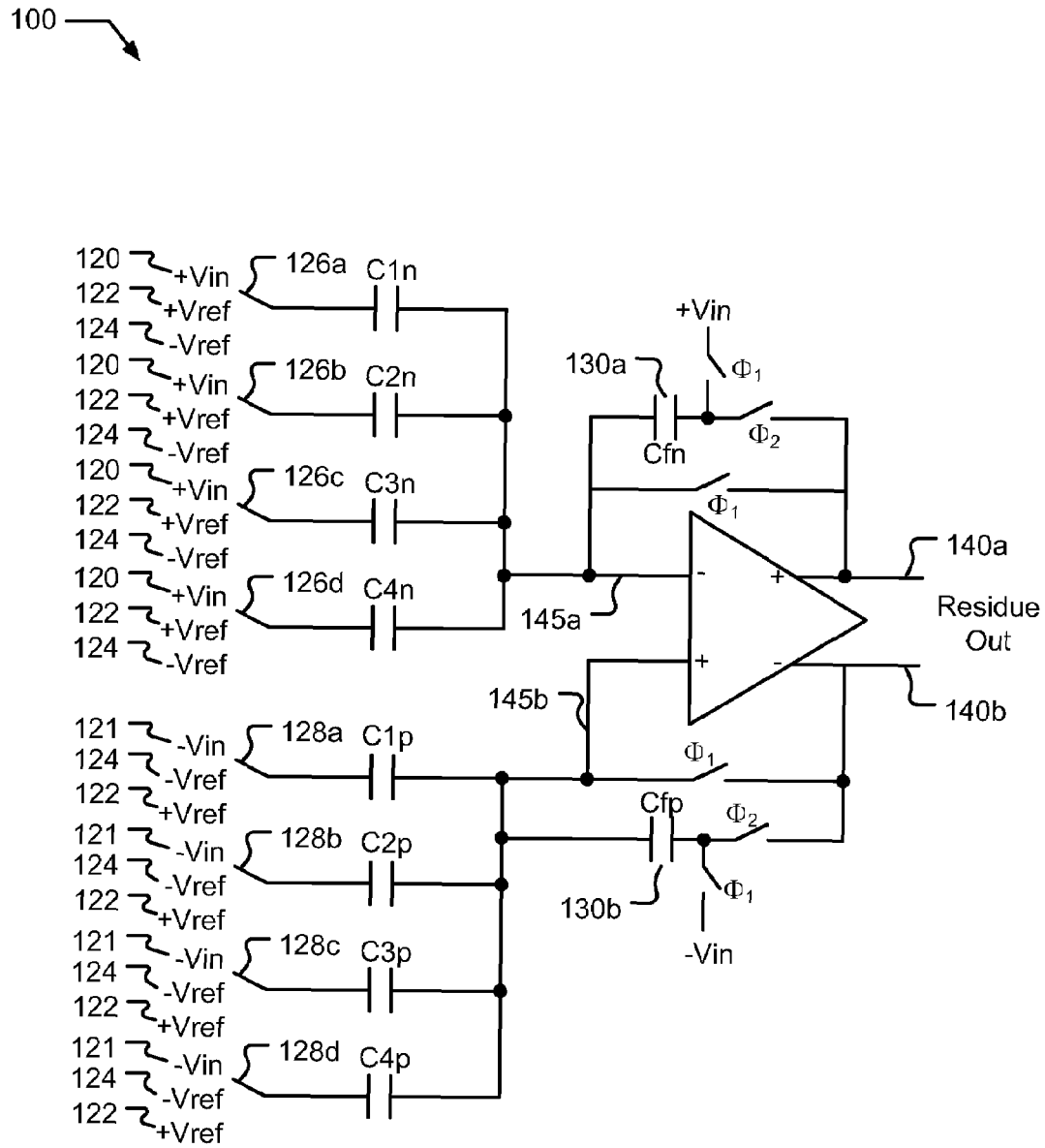
FIG. 1 depicts a prior art differential residue amplifier.
Figure 2A:
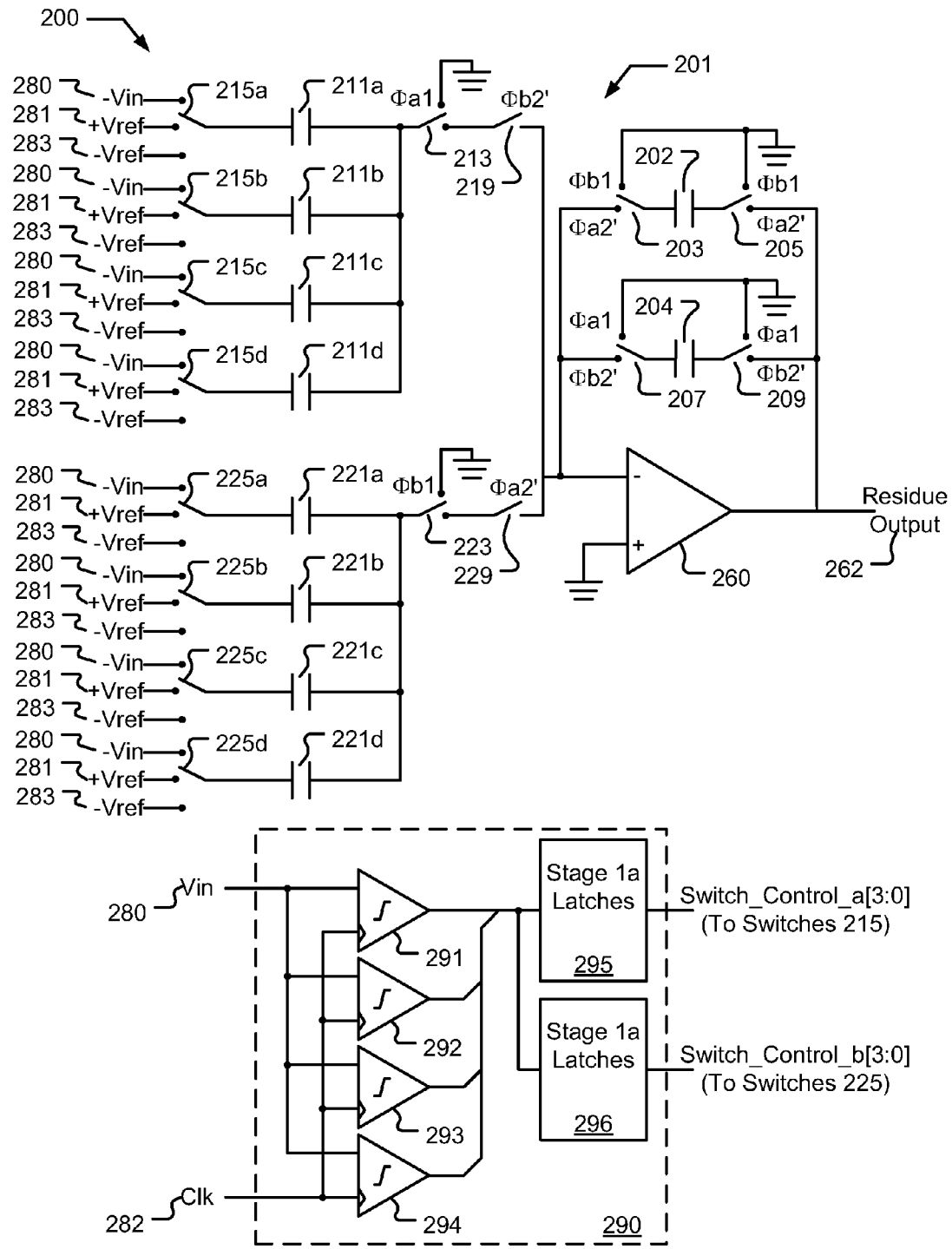
FIG. 2a depicts a switched residue amplifier forming part of a pipelined analog to digital converter in accordance with various embodiments of the present invention.

Turning to FIG. 2a, a switched residue amplifier 200 forming part of a pipelined analog to digital converter is shown in accordance with various embodiments of the present invention. Switched residue amplifier 200 includes an analog to digital converter 290 and a residue amplifier 201. Residue amplifier 201 includes an operational amplifier 260. A positive input of residue amplifier 260 is electrically coupled to ground. A negative input of operational amplifier 260 is electrically coupled to both an input circuit and a feedback circuit. The feedback circuit includes a first feedback capacitor 202 that is electrically coupled between the negative input and the output of operational amplifier 260 by control of switches 203, 205. Alternatively, both sides of capacitor 202 are electrically coupled to ground by control of switches 203, 205. In particular, during a period $\Phi a2$, capacitor 202 is electrically coupled as a feedback capacitor. During a period $\Phi b1$, capacitor 202 is grounded. The feedback circuit further includes a second feedback capacitor 204 that may be electrically coupled between the negative input and the output of operational amplifier 260 by control of switches 207, 209. Alternatively, both sides of capacitor 204 may be electrically coupled to ground by control of switches 207, 209. In particular, during a period $\Phi b2$, capacitor 204 is electrically coupled as a feedback capacitor. During a period $\Phi a1$, capacitor 204 is grounded.

The input circuit includes two sets of input capacitors 211, 221. Input capacitors 211 are each electrically coupled to an analog voltage input 280 during period $\Phi a$. At the same time, the other end of input capacitors 211 is electrically coupled to ground via a switch 213. This process operates to sample analog voltage input 280. Subsequently, during a period $\Phi a2$ input capacitors 211 are electrically coupled to either a positive voltage reference 281 or a negative voltage reference 283 by control of switches 215. This process operates to subtract a value from that maintained on input capacitors 211, and to leave only a value on input capacitors 211 corresponding to the residue value for the stage. During period $\Phi b2$, the residue value on input capacitors 211 is electrically coupled to the negative input of operational amplifier 260 via a switch 219. This residue value is then amplified and provides as residue output 262.

Similarly, input capacitors 221 are each electrically coupled to an analog voltage input 280 during period $\Phi b1$. At the same time, the other end of input capacitors 221 is electrically coupled to ground via a switch 223. This process operates to sample analog voltage input 280. Subsequently, during a period $\Phi b2$ input capacitors 221 are electrically coupled to either a positive voltage reference 281 or a negative voltage reference 283 by control of switches 225. This process operates to subtract a value from that maintained on input capacitors 221, and to leave only a value on input capacitors 221 corresponding to the residue value for the stage. During period $\Phi a2$, the residue value on input capacitors 221 is electrically coupled to the negative input of operational amplifier 260 via a switch 229. This residue value is then amplified and provides as residue output 262.

Analog to digital converter 290 includes four clocked comparators 291, 292, 293, 294 that each compare an analog voltage input 280 against different threshold voltages upon assertion of a clock signal 282. Subsequently, the output of comparators 291, 292, 293, 294 are latched into two separate latches 295, 296. The four values clocked into latch 295 operate to control switches 215 of residue amplifier 201, and the four values clocked into latch 296 operate to control switches 225 of residue amplifier 201.

Figure 2B:
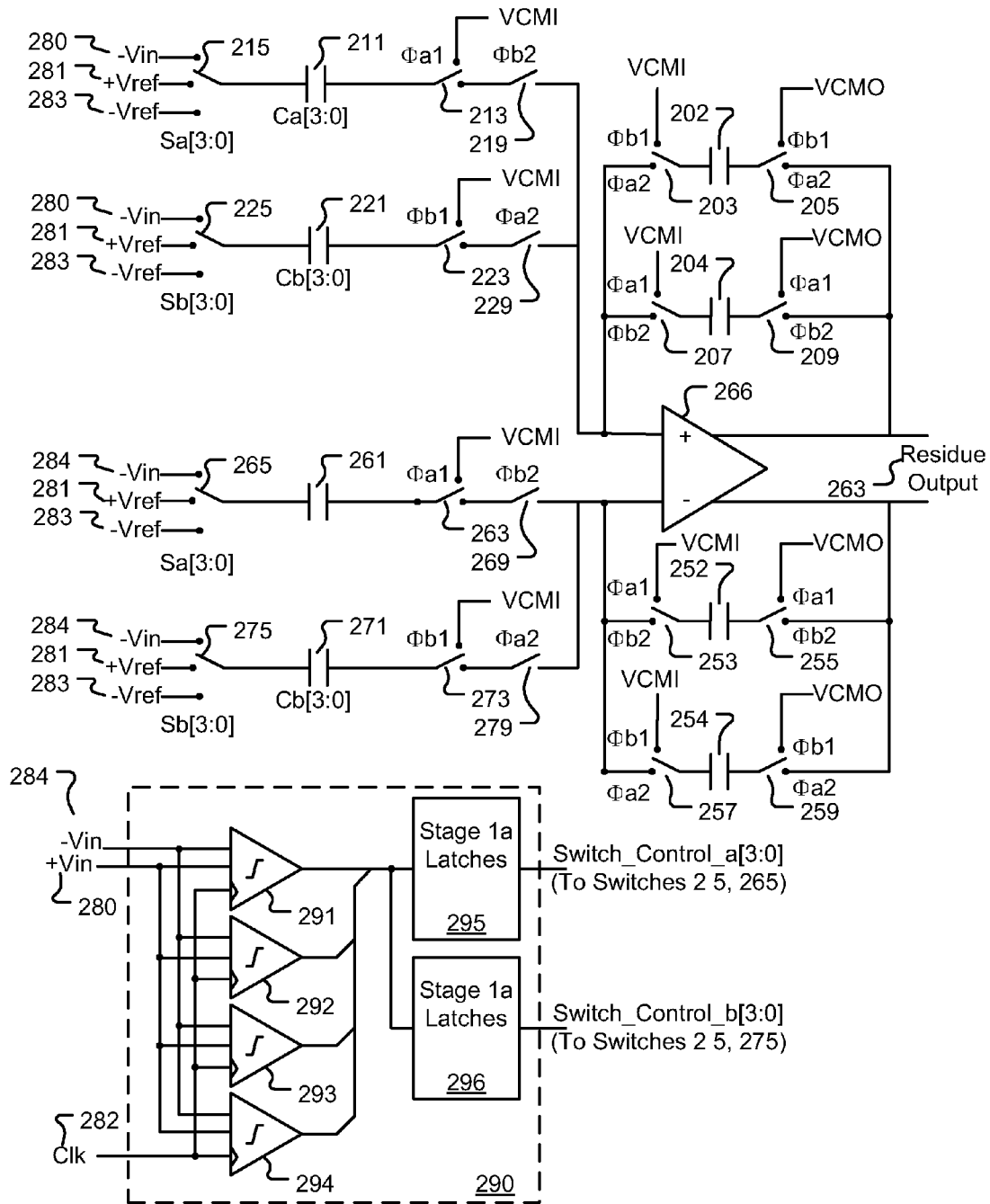
FIG. 2b shows a differential implementation of the switched residue amplifier of FIG. 2a in accordance with other embodiments of the present invention.

Turning to FIG. 2b, a differential implementation of the same analog to digital converter pipeline stage as that shown in FIG. 2a is depicted. The differential residue amplifier includes a differential operational amplifier 266 that provides a differential residue output 263. In addition to that described above in relation to FIG. 2a, a positive input of differential operational amplifier 266 is electrically coupled to both an input circuit and a feedback circuit. The feedback circuit includes a third feedback capacitor 252 that is electrically coupled between the positive input and the output of differential operational amplifier 266 by control of switches 253, 255. Alternatively, both sides of capacitor 252 are electrically coupled to ground (or a common mode output) by control of switches 253, 255. In particular, during a period $\Phi b2$, capacitor 252 is electrically coupled as a feedback capacitor. During a period $\Phi a1$, capacitor 252 is grounded (or connected to a common mode output). The feedback circuit further includes a fourth feedback capacitor 254 that may be electrically coupled between the positive input and the output of differential operational amplifier 266 by control of switches 257, 259. Alternatively, both sides of capacitor 254 may be electrically coupled to ground by control of switches 257, 259. In particular, during a period $\Phi a2$, capacitor 254 is electrically coupled as a feedback capacitor. During a period $\Phi b1$, capacitor 254 is grounded (or connected to a common mode output).

In addition to that described above in relation to FIG. 2a, the input circuit includes two additional sets of input capacitors 261, 271. Input capacitors 261 are each electrically coupled to a negative analog voltage input 284 during period $\Phi a1$. At the same time, the other end of input capacitors 271 is electrically coupled to ground (or a common mode input) via a switch 263. This process operates to sample negative analog voltage input 284. Subsequently, during a period $\Phi a2$ input capacitors 261 are electrically coupled to either a positive voltage reference 281 or a negative voltage reference 283 by control of switches 265. This process operates to subtract a value from that maintained on input capacitors 261, and to leave only a value on input capacitors 261 corresponding to the residue value for the stage. During period $\Phi b2$, the residue value on input capacitors 261 is electrically coupled to the positive input of operational amplifier 266 via a switch 269. This residue value is then amplified and provides as differential residue output 263.

Similarly, input capacitors 271 are each electrically coupled to negative analog voltage input 284 during period $\Phi b1$. At the same time, the other end of input capacitors 271 is electrically coupled to ground (or to a common mode input) via a switch 273. This process operates to sample negative analog voltage input 284. Subsequently, during a period $\Phi b2$ input capacitors 271 are electrically coupled to either a positive voltage reference 281 or a negative voltage reference 283 by control of switches 275. This process operates to subtract a value from that maintained on input capacitors 271, and to leave only a value on input capacitors 271 corresponding to the residue value for the stage. During period $\Phi a2$, the residue value on input capacitors 271 is electrically coupled to the positive input of differential operational amplifier 266 via a switch 279. This residue value is then amplified and provides as differential residue output 263.

Figure 3:
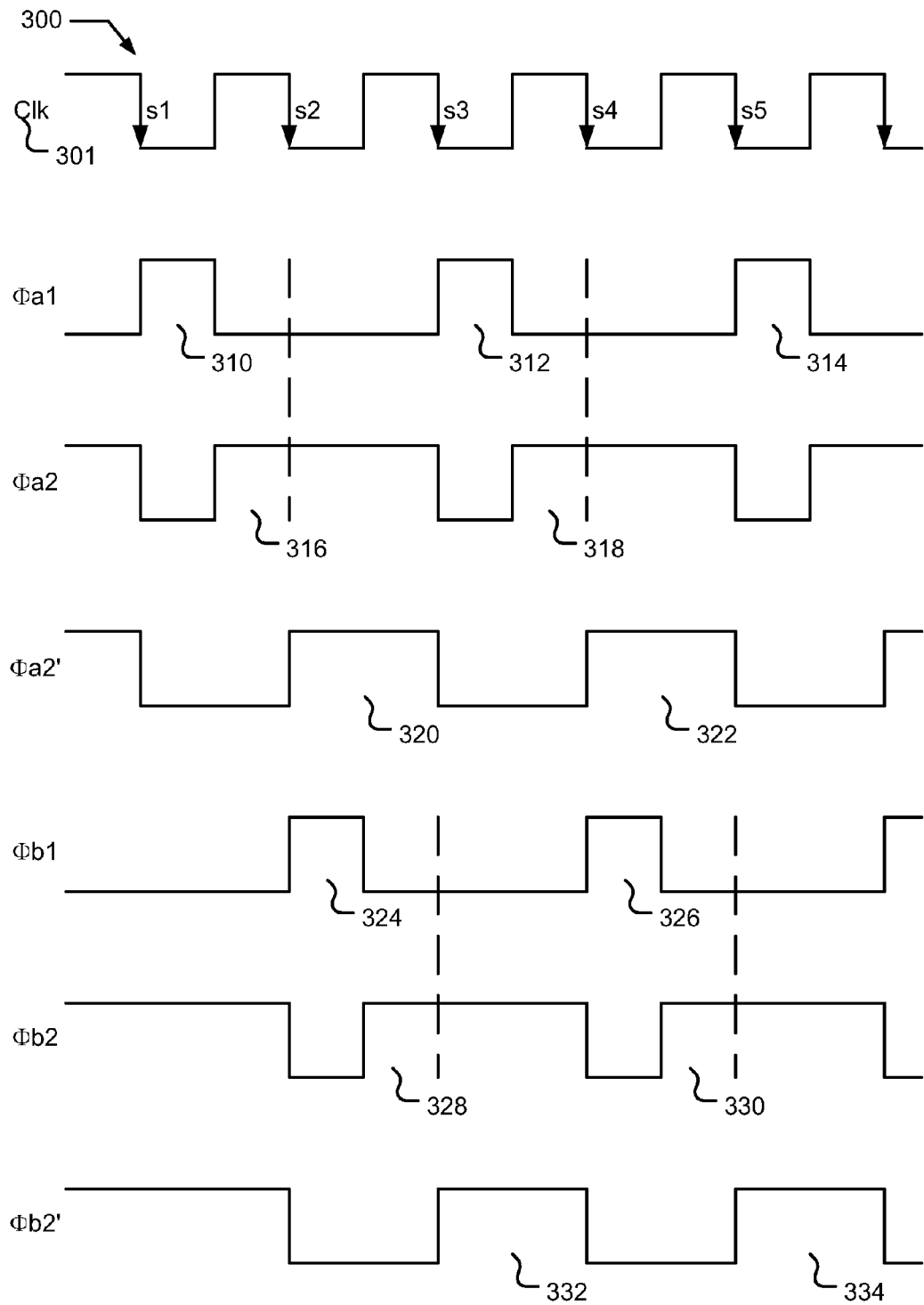
FIG. 3 is a timing diagram depicting exemplary operation of the switched residue amplifiers of FIGS. 2a-2b in accordance with some embodiments of the present invention.

Turning to FIG. 3, a timing diagram 300 depicts operation of switched residue amplifier 200 of FIG. 2a and its differential counterpart of FIG. 2b. As shown, a sample (designated s1, s2, s3, s4 and s5) is processed for each cycle of a clock input 301, but because of the novel circuit and corresponding clocking approach, resolution of the residue amplifier is not bounded by a single clock period. In particular, timing diagram 300 shows an exemplary relationship between clock input 301 and Φa1, Φa2, Φb1 and Φb2. During a period 310, input capacitors 211 are charged to a value corresponding to that of analog voltage input 280. Subsequently, during a period 316, the output of analog to digital converter 290 stabilizes and switches 215 are selectably set by the output respectively to either positive voltage reference 281 or negative voltage reference 283. This process leaves the residue value on capacitors 211. During the remainder of period Φa2 (designated as a period 320), the charge representing the residue value is transferred from capacitors 211 to feedback capacitor 202, and the amplification process resolves. While not explicitly discussed, it will be appreciated that the same diagram applies to charging and discharging input capacitors 261, 271 and feedback capacitors 252, 254 during the same designated periods.

In parallel, a second sample of analog voltage input 280 is taken by charging capacitors 221 during a period 324. Subsequently, during a period 328, the output of analog to digital converter 290 stabilizes and switches 225 are selectably set by the output respectively to either positive voltage reference 281 or negative voltage reference 283. This process leaves the residue value on capacitors 221. During the remainder of period Φb2 (designated as a period 332), the charge representing the residue value is transferred from capacitors 221 to feedback capacitor 204, and the amplification process resolves for the subsequent sample. This interleaved process of residue determination and amplification continues for subsequent samples during periods 312, 314, 318, 322, 326, 330, 334 as shown.

Thus, input sampling and residue calculation are interleaved between the two sets of capacitors. While one set of input capacitors (i.e., either input capacitors 211 or input capacitors 221) is connected to the stage input, the other set is connected to operational amplifier 260 to calculate the residue. This allows one full clock cycle for the input capacitors to be charged to the input, and one full clock cycle for residue amplifier 201 to settle. Where a differential stage is used, offset in the residue amplifier may be compensated at power-up by using a digital to analog converter to steer current into one side of the amplifiers differential stage or to the other side, as required to achieve zero residue output for zero input. This offset compensation technique removes the need to recapture the offset on the input capacitors as done in the prior art. By interleaving the input sampling and residue calculation operations and by compensating the amplifier offset at power-up, a full clock period is available for amplifier settling compared with typically one half clock period in the prior art. The amplifier gain-bandwidth required in this invention may in some cases be one half or less than that required by existing stage architectures. As a significant portion of all power dissipated in a pipelined analog to digital converter is dissipated in the residue amplifier(s), the aforementioned approach may result in substantial power savings. Based on the disclosure provided herein, one of ordinary skill in the art will appreciate a variety of other advantages that may be achieved through implementation of a pipelined analog to digital converter or converter stage in accordance with different embodiments of the present invention. As just some examples, by using a single sample and hold front end, double-sampled residue amplifiers, time-interleaved sub-ADCs, and proper clocking schemes, the sample aperture error may be reduced or eliminated, the time for comparator regeneration can be increased, parasitic charging can be increased, and residue amplifying/settling can be increased such that the gain-bandwidth requirements of the residue amplifiers are relaxed.

Figure 4:
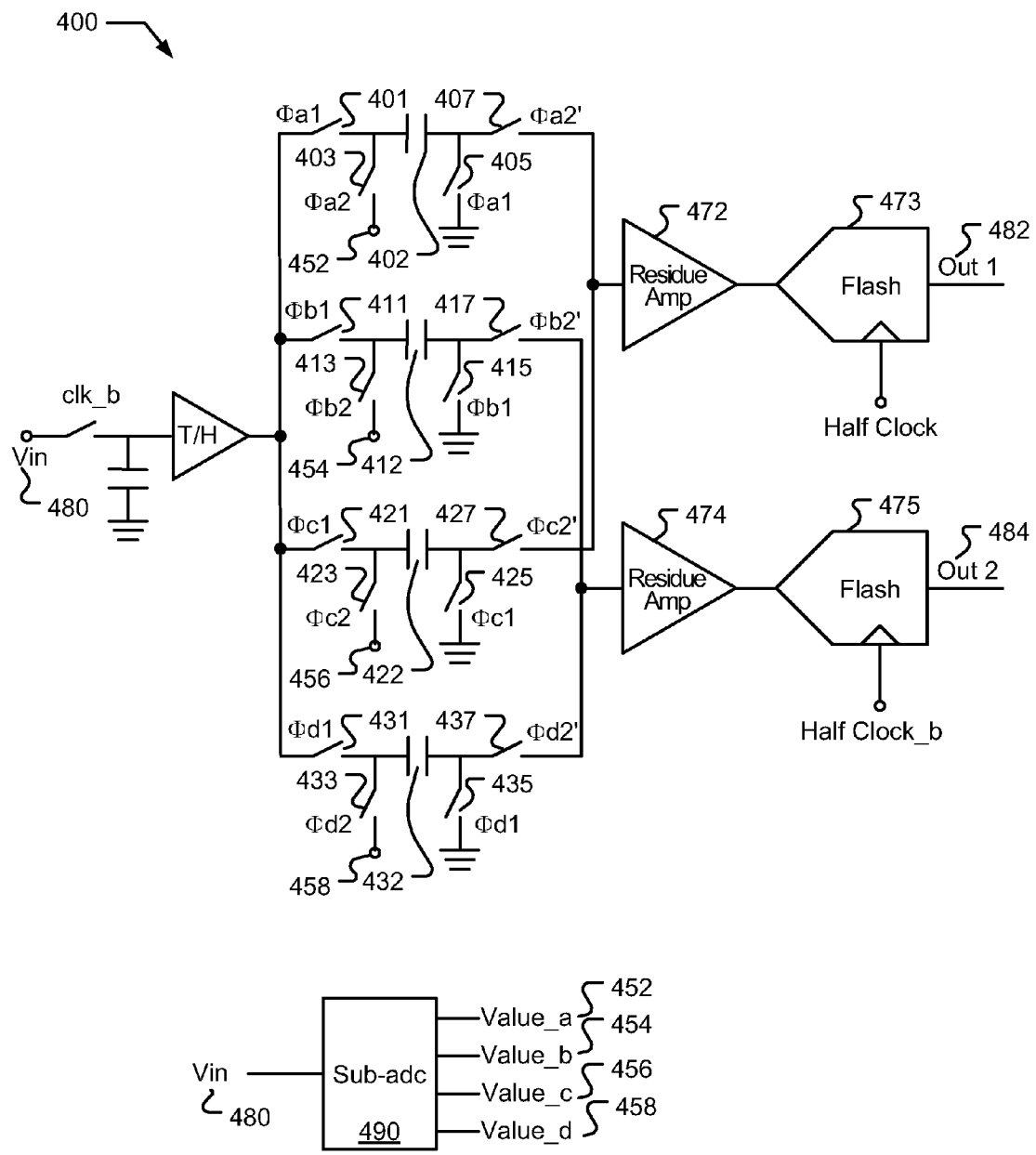
FIG. 4 shows an analog to digital converter stage 400 is shown in accordance with one or more embodiments of the present invention.

Turning to FIG. 4, an analog to digital converter stage 400 is shown in accordance with one or more embodiments of the present invention. Analog to digital converter stage 400 is essentially switched residue amplifier 200 extended to operate as a two-channel time-interleaved pipelined analog to digital converter. By using a single front end sample and hold, sampling aperture error may be reduced or eliminated, while increasing residue amplifying/settling time. An analog input voltage 480 is electrically coupled to two residue amplifiers 472, 474 via respective sets of input capacitors 402, 412, 422, 432. More particularly, the input to residue amplifier 472 is provided from a set of input capacitors 402 during a first period, and from a set of input capacitors 422 during a second period. The input to residue amplifier 474 is provided from a set of input capacitors 412 during a third period, and from a set of input capacitors 432 during a fourth period.

Prior to the first period, analog voltage input 480 is applied to input capacitors 402 by closing switches 401, 405. This effectively samples analog voltage input 480. A sub-adc 490 also samples analog voltage input 480 and provides either a positive voltage reference or a negative voltage reference to each of input capacitors 402 leaving only the residue. This is done by opening switches 401, 405, and closing a switch 403 and at the same time applying a subtraction value 452 to input capacitors 402. The residue value remaining on input capacitors 402 is then applied to residue amplifier 472 by closing switch 407. Residue amplifier 472 amplifies the residue and provides it to a flash analog to digital converter 473 (or to a subsequent analog to digital converter stage) that provides an output 482.

Prior to the second period, analog voltage input 480 is applied to input capacitors 412 by closing switches 411, 415. This effectively samples analog voltage input 480. Sub-adc 490 also samples analog voltage input 480 and provides either a positive voltage reference or a negative voltage reference to each of input capacitors 412 leaving only the residue. This is done by opening switches 411, 415, and closing a switch 413 and at the same time applying a subtraction value 454 to input capacitors 412. The residue value remaining on input capacitors 412 is then applied to residue amplifier 474 by closing switch 417. Residue amplifier 474 amplifies the residue and provides it to a flash analog to digital converter 475 (or to a subsequent analog to digital converter stage) that provides an output 483.

Prior to the third period, analog voltage input 480 is applied to input capacitors 422 by closing switches 421, 425. This effectively samples analog voltage input 480. Sub-adc 490 also samples analog voltage input 480 and provides either a positive voltage reference or a negative voltage reference to each of input capacitors 422 leaving only the residue. This is done by opening switches 421, 425, and closing a switch 423 and at the same time applying a subtraction value 456 to input capacitors 422. The residue value remaining on input capacitors 422 is then applied to residue amplifier 472 by closing switch 427. Residue amplifier 472 amplifies the residue and provides it to flash analog to digital converter 473 (or to a subsequent analog to digital converter stage) that provides output 482.

Prior to the second period, analog voltage input 480 is applied to input capacitors 432 by closing switches 431, 435. This effectively samples analog voltage input 480. Sub-adc 490 also samples analog voltage input 480 and provides either a positive voltage reference or a negative voltage reference to each of input capacitors 432 leaving only the residue. This is done by opening switches 431, 435, and closing a switch 433 and at the same time applying a subtraction value 458 to input capacitors 432. The residue value remaining on input capacitors 432 is then applied to residue amplifier 474 by closing switch 437. Residue amplifier 474 amplifies the residue and provides it to flash analog to digital converter 475 (or to a subsequent analog to digital converter stage) that provides output 483.

Figure 5:
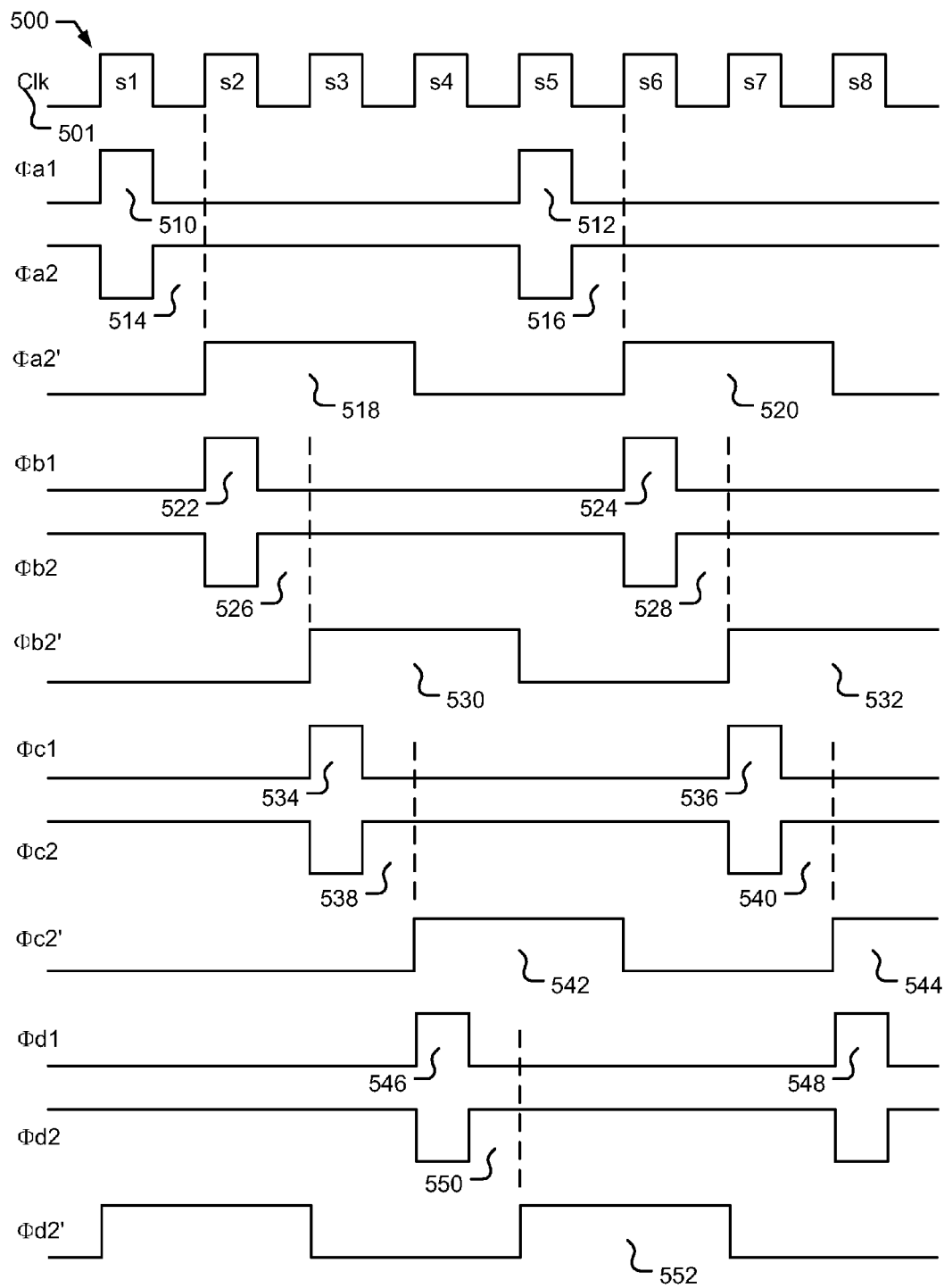
FIG. 5 is a timing diagram depicting an exemplary operation of the analog to digital converter stage of FIG. 4 in accordance with some embodiments of the present invention.

Turning to FIG. 5, a timing diagram 500 depicts operation of analog to digital converter stage 400 of FIG. 4. As shown, a sample (designated s1, s2, s3, s4, s5, s6, s7 and s8) is processed for each cycle of a clock input 501, but because of the novel circuit and corresponding clocking approach, resolution of the residue amplifier is not bounded by a half clock cycle. In particular, timing diagram 500 shows an exemplary relationship between clock input 501 and Φa1, Φa2, Φb1, Φb2, Φc1, Φc2, Φd1, and Φd2. During a period 510, input capacitors 402 are charged to a value corresponding to that of analog voltage input 480 when switch 401 and switch 405 are closed. Subsequently, during a period 514, subtraction value 452 from sub-adc 490 stabilizes and is added to the previously established value on input capacitors 402. This process leaves the residue value on capacitors 402. During a period 518, the charge representing the residue value is transferred from capacitors 402 to residue amplifier 472 by closing switch 407, and the amplification process resolves. Similarly, during a period 522, input capacitors 412 are charged to a value corresponding to that of analog voltage input 480 when switch 411 and switch 415 are closed. Subsequently, during a period 526, subtraction value 456 from sub-adc 490 stabilizes and is added to the previously established value on input capacitors 412. This process leaves the residue value on capacitors 412. During a period 530, the charge representing the residue value is transferred from capacitors 412 to residue amplifier 472 by closing switch 417, and the amplification process resolves.

During a period 534, input capacitors 422 are charged to a value corresponding to that of analog voltage input 480 when switch 421 and switch 425 are closed. Subsequently, during a period 538, subtraction value 454 from sub-adc 490 stabilizes and is added to the previously established value on input capacitors 422. This process leaves the residue value on capacitors 422. During a period 542, the charge representing the residue value is transferred from capacitors 422 to residue amplifier 474 by closing switch 427, and the amplification process resolves. Similarly, during a period 546, input capacitors 432 are charged to a value corresponding to that of analog voltage input 480 when switch 431 and switch 435 are closed. Subsequently, during a period 550, subtraction value 458 from sub-adc 490 stabilizes and is added to the previously established value on input capacitors 432. This process leaves the residue value on capacitors 432. During a period 552, the charge representing the residue value is transferred from capacitors 432 to residue amplifier 474 by closing switch 437, and the amplification process resolves. The aforementioned processes are repeated for subsequent samples during periods 512, 516, 520, 524, 528, 532, 536, 540, 544, and 548 as shown.

Figure 6:
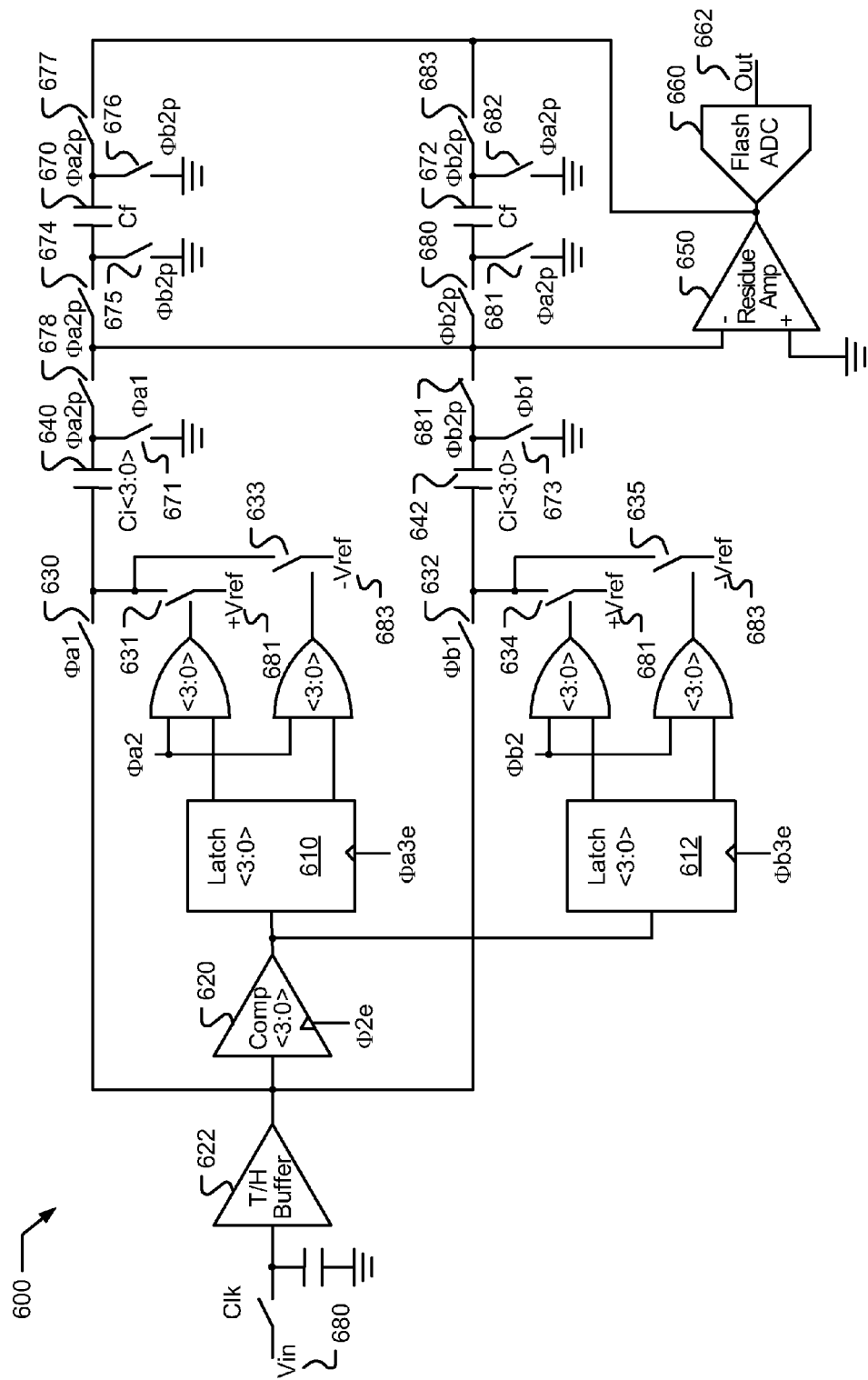
Figure 7:
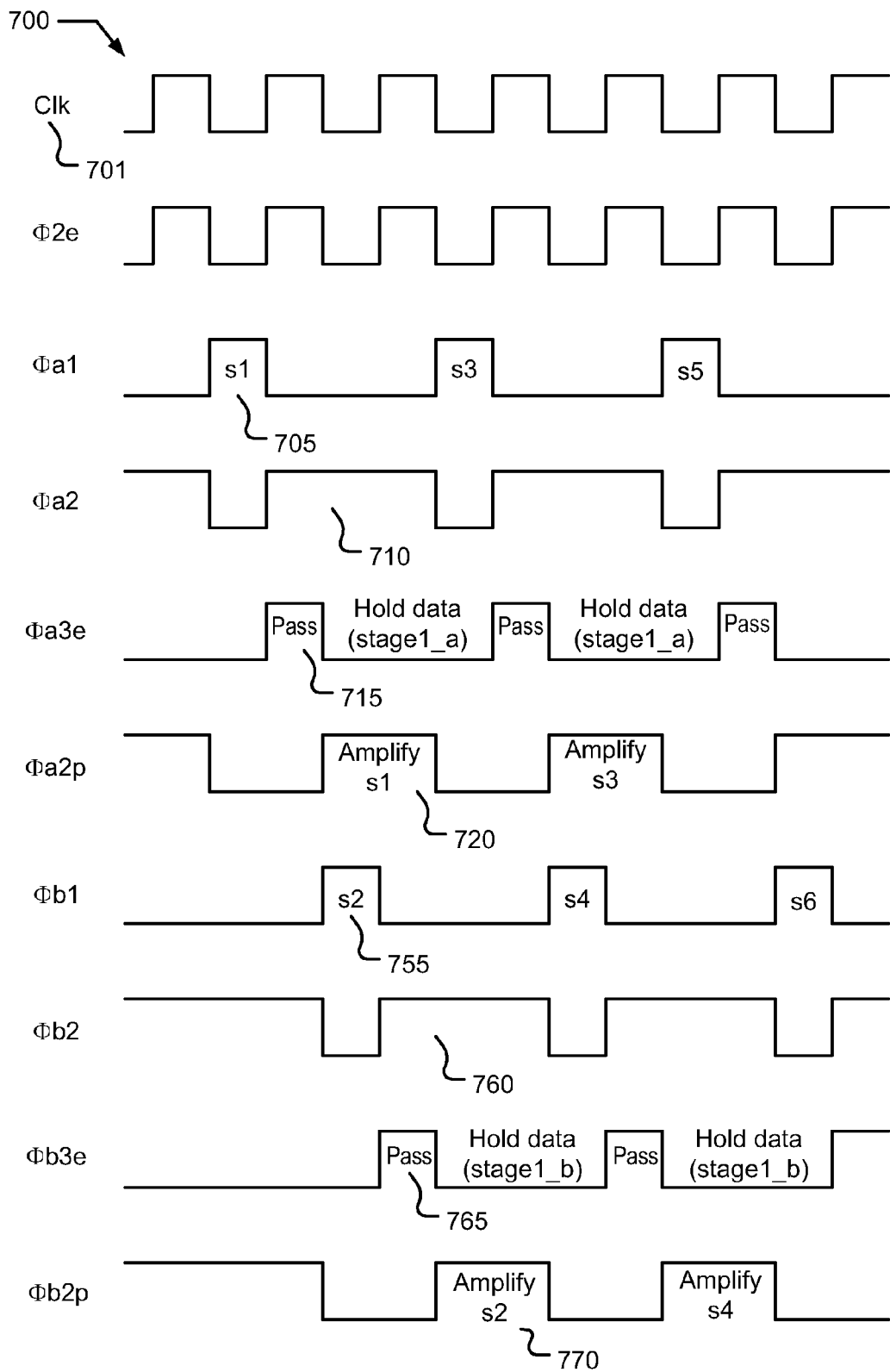
FIG. 7 is a timing diagram depicting operation of analog to digital converter stage of FIG. 6.

Turning to FIG. 6, a particular implementation of switched residue amplifier 200 is shown. In particular, an analog to digital converter stage 600 includes an analog voltage input 680 that is provided to a residue amplifier 650 and a sub-adc via a buffer 622. The sub-adc includes a set of comparators 620 that compare analog voltage input 680 against respective threshold voltages. The outputs from comparators 620 are provided to latches 610, 612 that are clocked by distinct clock inputs. The outputs from latches 610, 612 are gated with control clocks, and in turn are used to control switches 631, 633, 634, 635. Switches 631, 633, 634, 635 respectively connect positive voltage reference 681 or negative voltage reference 683 to capacitor sets 640, 642. Capacitor sets 640, 642 are also electrically coupled to analog voltage input 680 via switch 630 and switch 632. Input capacitors 640 are electrically coupled to residue amplifier 650 whenever switch 678 is closed, otherwise they are connectable to ground via a switch 671. Input capacitors 642 are electrically coupled to residue amplifier 650 whenever switch 684 is closed, otherwise they are connectable to ground via a switch 673. Residue amplifier 650 includes a first feedback capacitor 670 and a second feedback capacitor 672. When switch 674 and switch 677 are closed, feedback capacitor 670 is connected, otherwise, when switch 675 and switch 676 are closed capacitor 670 is discharged. When switch 680 and switch 683 are closed, feedback capacitor 672 is connected, otherwise, when switch 681 and switch 682 are closed capacitor 672 is discharged. The output of residue amplifier 650 is provided to a flash analog to digital converter that provides a digital output 662. Turning to FIG. 7, a timing diagram 700 depicts operation of analog to digital converter stage 600 of FIG. 6. As shown, a sample (designated s1, s2, s3, s4, s5, and s6) is processed for each cycle of a clock input 501, but because of the novel circuit and corresponding clocking approach, resolution of the residue amplifier is not bounded by the approximately one half clock cycle of the prior art. It should be noted that during the periods marked as "pass", that comparator regeneration, charging the parasitics, and charge re-distribution among the input capacitors occurs. In some embodiments of the present invention, feedback capacitors 670, 672, and input capacitors 640, 642 are relatively small (e.g., 50 fF per unit). The parasitic capacitance may be large compared to the primary capacitance, and the extra half clock period increases the effective residue amplifying/settling time significantly.

Turning to FIG. 7, a timing diagram 700 depicts operation of analog to digital converter stage 600. As shown, a sample (designated s1, s2, s3, s4, s5, and s6) is processed for each cycle of a clock input 701, but because of the novel circuit and corresponding clocking approach, resolution of the residue amplifier is not bounded by a half clock cycle. In particular, timing diagram 700 shows an exemplary relationship between clock input 501 and Φa1, Φa2, Φa3a, Φa2p, Φb1, Φb2, Φb3e, and Φb2p. During a period 705, input capacitors 640 are charged by closing switch 630. During a period 710, switch 631 and switch 633 are closed allowing the output of latches 610 to pass to input capacitors 640. During period 715, the output of comparators 620 propagate into latches 610 and are stable at the end of the period. During the remaining portion of period 710 (i.e., period 720), feedback capacitors 670 are connected to input capacitors 640 to form the desired connection of residue amplifier 650 by closing switches 678, 674, 677. Thus, during period 720, the amplification process of residue amplifier 650 completes and output 662 is provided.

Similarly, during a period 755, input capacitors 642 are charged by closing switch 632. During a period 760, switch 634 and switch 635 are closed allowing the output of latches 612 to pass to input capacitors 642. During period 765, the output of comparators 620 propagate into latches 612 and are stable at the end of the period. During the remaining portion of period 760 (i.e., period 770), feedback capacitors 672 are connected to input capacitors 642 to form the desired connection of residue amplifier 650 by closing switches 684, 680, 683. Thus, during period 770, the amplification process of residue amplifier 650 completes and output 662 is provided for the particular pipe.

It should be noted that the various circuits and clocking schemes described herein are substantially different from the prior art in that one half clock period and one-and a half clock periods are used to charge and discharge the capacitors, respectively. For example, in the circuits of FIGS. 2, the half clock period after the rising edge of Φa2 is used for comparator regeneration, charging the bottom-plate parasitics of the capacitors, and re-distribute the charge among the capacitors (it is drawn as one single capacitor, but there maybe several capacitors in actual implementation, as shown in the following example). The advantage of this clocking scheme is that one full clock period is used for the residue amplifying/settling (non-overlap requirement is neglected). This is crucial for high speed operations, where even a small amount of extra settling time is critical. For prior arts, there is totally one clock period for the comparator regeneration, parasitic charging, charge re-distribution and residue amplifying/settling. So the residue amplifying/settling time is less than one clock period.

In conclusion, the invention provides novel systems, circuits, methods and arrangements for converting an analog signal to a digital signal. While detailed descriptions of one or more embodiments of the invention have been given above, various alternatives, modifications, and equivalents will be apparent to those skilled in the art without varying from the spirit of the invention. For example, while the disclosed embodiments are shown as differential cases, other embodiments of the present invention may be implemented as single ended inputs. Therefore, the above description should not be taken as limiting the scope of the invention, which is defined by the appended claims.

What is claimed is:

1. An analog to digital converter, wherein the analog to digital converter comprises:
   a residue amplifier, wherein the residue amplifier is associated with a first capacitance set that includes a first feedback capacitor and first set of input capacitors, and a second capacitance set that includes a second feedback capacitor and second set of input capacitors, wherein the first capacitance set is separately switched from the second capacitance set, and wherein a portion of a clock cycle is provided for charging the first set of input capacitors, and a full clock cycle is provided for settling the residue amplifier.

2. The analog to digital converter of claim 1, wherein charging of the first set of input capacitors is interleaved with charging of the second set of input capacitors.

3. The analog to digital converter of claim 2, wherein charge transfer from the first set of input capacitors to the first feedback capacitor is interleaved with charge transfer from the second set of input capacitors to the second feedback capacitor.

4. The analog to digital converter of claim 1, wherein the first set of input capacitors are electrically coupled to an analog voltage input during a first period, wherein the second set of input capacitors are electrically coupled to the residue amplifier during the first period, wherein the second set of input capacitors are electrically coupled to the analog voltage input during a second period, and wherein the second set of input capacitors are electrically coupled to the residue amplifier during the second period.

5. The analog to digital converter of claim 4, wherein the analog to digital converter further includes:
   a sub-adc, wherein the sub-adc receives the analog voltage input and provides a digital representation of the analog voltage input, and wherein the digital representation of the analog voltage input is used to perform a voltage subtraction from the first set of input capacitors to leave a residue value.

6. The analog to digital converter of claim 5, wherein the residue value is a first residue value, and wherein the analog to digital converter further includes:
   wherein a subsequent digital representation of the analog voltage input is used to perform a voltage subtraction from the second set of input capacitors to leave a second residue value.

7. A method for performing an analog to digital conversion, the method comprising:
   providing an analog to digital converter, wherein the analog to digital converter includes a residue amplifier associated with a first capacitance set that includes a first feedback capacitor and first set of input capacitors, and a second capacitance set that includes a second feedback capacitor and second set of input capacitors;
   performing a first sample of an analog input voltage by charging the first set of input capacitors from the analog voltage input during a first period;
   amplifying the first sample during a second period;
   performing a second sample of the analog input voltage by charging the second set of input capacitors from the analog voltage input during a third period;
   amplifying the second sample during a fourth period; and
   wherein the first period overlaps the fourth period, and wherein the third period overlaps the second period.

8. The method of claim 7, wherein the first period and the third period are each approximately one half clock cycle, and wherein the second period and the fourth period are each one full clock cycle.

9. The method of claim 7, wherein the first period and the third period are mutually exclusive.

10. The method of claim 7, wherein the second period and the fourth period are mutually exclusive.

11. The method of claim 7, wherein the method further comprises:
    transferring charge from the first set of input capacitors to the first feedback capacitor during a fifth period continuing subsequent to the first period.

12. The method of claim 11, wherein the method further comprises:
    transferring charge from the second set of input capacitors to the second feedback capacitor during a sixth period continuing subsequent to the third period.

13. The method of claim 7, wherein the analog to digital converter further includes:
    a sub-adc, wherein the sub-adc receives the analog voltage input and provides a digital representation of the analog voltage input, wherein the digital representation of the analog voltage input is used to perform a voltage subtraction from the first set of input capacitors to leave a first residue value, and wherein a subsequent digital representation of the analog voltage input is used to perform a voltage subtraction from the second set of input capacitors to leave a second residue value.

14. The method of claim 13, wherein amplifying the first sample during a second period is amplifying the first residue value; and wherein amplifying the second sample during a fourth period is amplifying the second residue value.

15. An analog to digital converter, wherein the analog to digital converter includes:
    a residue amplifier, wherein the residue amplifier is associated with a first capacitance set that includes a first feedback capacitor and first set of input capacitors, and a second capacitance set that includes a second feedback capacitor and second set of input capacitors, and wherein the first capacitance set is separately switched from the second capacitance set; and a sub-adc, wherein an output from the sub-adc controls a first value subtraction from a first value maintained on the first set of input capacitors to create a first residue value, and a second value subtraction from a second value maintained on the second set of input capacitors to create a second residue value.

16. The analog to digital converter of claim 15, wherein the residue amplifier is shared between two pipeline stages.

17. The analog to digital converter of claim 15, wherein approximately one half of a clock cycle is provided for charging the first set of input capacitors to a value corresponding to an analog voltage input, and wherein a full clock cycle is provided for amplifying the first residue value.

18. The analog to digital converter of claim 17, wherein the value corresponding to the analog voltage input is a first value, wherein the approximately one half clock cycle is a first period, wherein the full clock cycle is a second period, wherein a third period corresponding in length to the first period is provided for charging the second set of input capacitors to a second value corresponding to the analog voltage input, wherein a fourth period corresponding in length to the second period is provided for amplifying the second residue value, and wherein the first period and the third period are mutually exclusive, and wherein the second period and the fourth period are mutually exclusive.

19. A pipelined analog to digital converter, wherein the pipelined analog to digital converter comprises:
a residue amplifier, wherein the residue amplifier is associated with a first capacitance set that includes a first feedback capacitor and first set of input capacitors, and a second capacitance set that includes a second feedback capacitor and second set of input capacitors, wherein the first capacitance set is separately switched from the second capacitance set, and wherein the residue amplifier is shared between two pipeline stages.

20. An analog to digital converter, wherein the analog to digital converter comprises:
a residue amplifier, wherein the residue amplifier is associated with a first capacitance set that includes a first feedback capacitor and a first set of input capacitors, and a second capacitance set that includes a second feedback capacitor and a second set of input capacitors, wherein the first capacitance set is separately switched from the second capacitance set, wherein the first set of input capacitors are electrically coupled to an analog voltage input during a first period, wherein the second set of input capacitors are electrically coupled to the residue amplifier during the first period, wherein the second set of input capacitors are electrically coupled to the analog voltage input during a second period, and wherein the second set of input capacitors are electrically coupled to the residue amplifier during the second period.

21. The analog to digital converter of claim 20, wherein the analog to digital converter further includes:
a sub-adc, wherein the sub-adc receives the analog voltage input and provides a digital representation of the analog voltage input, and wherein the digital representation of the analog voltage input is used to perform a voltage subtraction from the first set of input capacitors to leave a residue value.

22. The analog to digital converter of claim 5, wherein the residue value is a first residue value, and wherein the analog to digital converter further includes:
wherein a subsequent digital representation of the analog voltage input is used to perform a voltage subtraction from the second set of input capacitors to leave a second residue value.

* * * * *